(12) United States Patent
Comendant

(10) Patent No.: US 8,503,151 B2
(45) Date of Patent: Aug. 6, 2013

(54) PLASMA ARRESTOR INSERT

(75) Inventor: Keith Comendant, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 933 days.

(21) Appl. No.: 12/570,263

(22) Filed: Sep. 30, 2009

(65) Prior Publication Data
US 2011/0075313 A1    Mar. 31, 2011

(51) Int. Cl.
*H01H 9/30* (2006.01)
*H01H 73/18* (2006.01)
(52) U.S. Cl.
USPC ............. 361/134; 361/111; 361/12; 361/14
(58) Field of Classification Search
USPC ............... 361/111, 121, 134, 12, 14
See application file for complete search history.

(56) References Cited

U.S. PATENT DOCUMENTS

| | | | | |
|---|---|---|---|---|
| 2,293,513 A | * | 8/1942 | Linde | 218/149 |
| 3,040,203 A | * | 6/1962 | Hager | 313/231.21 |
| 4,356,527 A | * | 10/1982 | Asinovsky et al. | 361/134 |
| 5,616,898 A | * | 4/1997 | Maineult | 218/76 |
| 6,559,580 B1 | * | 5/2003 | Deutsch et al. | 313/231.01 |
| 7,521,026 B2 | * | 4/2009 | Rosocha et al. | 422/186.04 |

* cited by examiner

*Primary Examiner* — Rexford N Barnie
*Assistant Examiner* — Zeev V Kitov

(57) ABSTRACT

A dielectric arrestor insert for use in a chamber wafer processing system having a gas input line, an arrestor housing and a wafer processing space. The input line is able to provide gas to the arrestor housing. The arrestor housing is able to house the dielectric arrestor insert. The dielectric arrestor insert comprises a gas entry portion, a non-linear channel and a gas exit portion. The gas entry portion is arranged to receive the gas from the input line. The non-linear channel is arranged to deliver the gas from the gas entry portion to the gas exit portion. The gas exit portion is arranged to deliver the gas from the non-linear channel to the wafer processing space.

9 Claims, 6 Drawing Sheets

PLASMA ARRESTOR INSERT

The present application claims benefit under 35 U.S.C. §119 (e) to U.S. provisional patent application 61/165,270, filed Mar. 31, 2009, the entire disclosure of which is incorporated herein by reference.

BACKGROUND

The semiconductor manufacturing industry places increased emphasis on cost savings and efficiency to increase a constantly dwindling profit margin. One important effort to drive costs lower is to preserve components within a system that requires extremely high ion energy at the substrate surface when using helium based plasma to complete the required etching process. To create this high ion energy at the substrate surface, a high voltage is applied at the substrate surface, which creates a large electrical field gradient extending back into the helium supply line, which in turn creates unwanted electrical arcing between surfaces and generates plasma in the supply lines and other components. This produces adverse effects such as pitting and melting of the supply lines. Disposing an electrical insulator between the area of high electrical potential and the supply lines can minimize impact of unwanted electrical arcing and plasma generation. However, such electrical insulators increase cost of ownership. Great care must be taken to avoid the unnecessary wear rate of system parts.

FIG. 1 is a cross-sectional view of a conventional helium supply system 100 of a chamber wafer processing system 112. System 100 includes a flexible helium supply line 102, a metallic weldment 104, a dielectric arrestor insert 106, a dielectric arrestor housing 108, an ESC mounting plate 118, and a bowl housing assembly 116. Arrestor housing 108 is shaped to include a cylindrical cavity 120 for holding dielectric arrestor insert 106. Flexible helium supply line 102, metallic weldment 104, dielectric arrestor insert 106, arrestor housing 108, and ESC mounting plate 118 reside in bowl housing assembly 116. Chamber wafer processing system 112 includes an electro-static chuck (ESC) 110 that is operable to electrostatically hold a wafer for processing.

In operation, helium is supplied to chamber wafer processing system 112 via conventional helium supply system 100. The path of the helium through conventional helium supply system 100 as indicated by arrows within flexible helium supply line 102, metallic weldment 104 and arrows 114 through dielectric arrestor insert 106.

Operation of the ESC requires the use of high voltage DC power be applied to clamp the wafer, and high-frequency RF power to generate the plasma needed for wafer processing. Helium is supplied to the ESC to effect thermal sinking between the wafer and the ESC 110. Application of either the high voltage DC or RF power can, in turn, excite the helium to a point where electrons are able to escape the bond of the helium atom, thus generating plasma. The time at which gaseous helium is converted into plasma is commonly referred to as "light-up."

Mounting plate 118, which is usually operated at a high voltage potential similar to what that of ESC 110, is electrically-separated from flexible helium supply line 102 and metallic weldment 104, by arrestor housing 108, and dielectric arrestor insert 106. Bowl housing assembly 116 is at ground potential. It is desirable that flexible helium supply line 102 and metallic weldment 104 be shielded from the electrical and magnetic field effects from ESC 110. Further, the electrical potential of metallic weldment 104 and flexible helium supply line 102 should closely match that of bowl housing assembly 116 to prevent electrical arcing between the two, or to prevent a high voltage potential between the two so as to cause light-up within flexible helium supply line 102. If electrical arcing occurs, damage to bowl components can occur. If plasma light-up occurs, pitting and melting of the supply lines and other components within bowl housing assembly 116 can occur. The requirement to hold metallic weldment 104 at the ground potential of bowl 116 results in a large voltage potential impressed across arrestor housing 108, and dielectric arrestor insert 106.

At lower helium pressures between 1 to 50 Torr (pressures between $1/760$ and $50/760$ of standard atmospheric pressure), which is typical of normal operating conditions of chamber wafer processing system 112 and system 100; the helium can conduct electrical current and generate electrical arcing under certain conditions. The likelihood of plasma generation or arcing within arrestor housing 108 and dielectric arrestor insert 106 is directly related to the voltage potential difference, and inversely related to the gas path length, between metallic weldment 104 and mounting plate 118, and is also directly related to the cross-section mean free path available, which will be discussed in more detail below.

FIG. 2A is an oblique view of dielectric arrestor insert 106. Dielectric arrestor insert 106 includes a first cylindrical portion 202, spaced from a second cylindrical portion 204 via a circumferential channel 206. First cylindrical portion 202 has a circular face 208, whereas second cylindrical portion 204 has a circular face 210. Circular face 208 has a helium entry 216, whereas circular face 210 has a helium exit 218. A longitudinal channel 212, having a width $d_1$ and a depth $d_2$, extends from helium entry 216 at circular face 210 to circumferential channel 206, whereas a longitudinal channel 214 extends from circumferential channel 206 to helium exit 218.

FIG. 2B is a cross-sectional view of dielectric arrestor insert 106. In the figure, helium gas flows along a path indicated by arrows 114. Specifically, helium provided by metallic weldment 104 enters helium entry 216, proceeds through longitudinal channel 212, proceeds around circumferential channel 206, continues through longitudinal channel 214 and finally exits out helium exit 218 into chamber wafer processing system 112. The total distance that the helium gas travels in dielectric arrestor insert 106 includes the length of longitudinal channel 212, half the circumference of circumferential channel 206 and the length of longitudinal channel 214.

Returning back to FIG. 1, dielectric arrestor insert 106 is tightly disposed within cylindrical cavity 120 of arrestor housing 108. Accordingly, cylindrical cavity 120 closes longitudinal channel 212, circumferential channel 206 and longitudinal channel 214 to form tubes such that helium gas will only pass through longitudinal channel 212, circumferential channel 206 and longitudinal channel 214. Dielectric arrestor insert 106 provides an insulator block between a low electrical potential of metallic weldment 104 and a high potential of mounting plate 118. Metallic weldment 104 is at or near ground potential and mounting plate 118 is at a high electrical potential. Because of the voltage difference between metallic weldment 104 and mounting plate 118, there is a possibility of light up and arcing of helium within dielectric arrestor insert 106 or arrestor housing 108. At least one of two tactics may be employed to reduce the potential of arcing or light-up in dielectric arrestor insert 106 or arrestor housing 108.

First, width $d_1$ and depth $d_2$ of longitudinal channel 212 of dielectric arrestor insert 106 can be decreased. For a constant supply of helium, decreasing width $d_1$ and depth $d_2$ of longitudinal channel 212 of dielectric arrestor insert 106 will reduce the cross-sectional area and thus reduce the space for electrons to move in an excited state to produce plasma. A problem with this tactic is that decreasing the width $d_1$ and depth $d_2$ of longitudinal channel 212 of dielectric arrestor insert 106 will increase the pressure drop across the components, and that will decrease the amount of helium supplied into wafer processing system 112.

Second, the total length that the helium gas travels in dielectric arrestor insert 106 can be increased. This will effectively increase the distance between metallic weldment 104 and ESC 110 as viewed from an electrostatic field induced through helium within longitudinal channel 212, circumferential channel 206 and longitudinal channel 214. This will reduce the voltage gradient over the total length that the helium gas travels in dielectric arrestor insert 106 making dielectric arrestor insert 106 a better insulator block. However, arcing or light-up potential can be an issue if the increased length comes in the form of a longer, line-of-site path. Also, there is only a limited amount of space in arrestor housing 108 and bowl housing assembly 116. As such, in system 100, this is not a viable option.

Finally, the dielectric constant of the electrically insulative material may be decreased.

The dielectric arrestor insert 106 includes a width $d_1$ and depth $d_2$ of longitudinal channel 212 that is sufficiently large to provide sufficient helium into wafer processing system 112. Further, as noted above, the total length that the helium gas travels in dielectric arrestor insert 106 includes the space in arrestor housing 108. The width $d_1$ and depth $d_2$ of longitudinal channel 212 in combination with a short total length that the helium gas travels in dielectric arrestor insert 106 affect the ability of dielectric arrestor insert 106 to prevent arcing and plasma generation in dielectric arrestor insert 106 itself.

What is needed is a dielectric arrestor insert that decreases the likelihood of arcing and plasma generation in the dielectric arrestor insert itself, while not causing and adverse pressure drop.

BRIEF SUMMARY

It is an object of the present invention to provide a dielectric arrestor insert that decreases the likelihood of arcing and plasma generation in the dielectric arrestor insert.

In accordance with an aspect of the present invention, a dielectric arrestor insert may be used in a chamber wafer processing system having a gas input line, an arrestor housing and a wafer processing space. The input line is able to provide gas to the arrestor housing. The arrestor housing is able to house the dielectric arrestor insert. The dielectric arrestor insert comprises a gas entry portion, a non-linear channel and a gas exit portion. The gas entry portion is arranged to receive the gas from the input line. The non-linear channel is arranged to deliver the gas from the gas entry portion to the gas exit portion. The gas exit portion is arranged to deliver the gas from the non-linear channel to the wafer processing space.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

In a helium supply system that supplies helium to a chamber wafer processing system, a portion of the helium supply system may be at or near ground potential, whereas a portion of the chamber wafer processing system may have a high electrical potential. In such a case, helium within the helium supply line or in the dielectric arrestor insert positioned to supply helium into the chamber wafer processing system has a likelihood of plasma light-up or electrical arcing. In accordance with an aspect of the present invention, the likelihood of helium light-up within the dielectric arrestor insert or arrestor housing is decreased by increasing the length that the helium gas travels in the dielectric arrestor insert. More particular, in accordance with an aspect of the present invention, a dielectric arrestor insert includes non-linear channels into which the helium gas passes. The non-linear channels increase the distance that the helium gas travels in dielectric arrestor insert as compared to the conventional dielectric arrestor insert, while concurrently limiting direct line-of-sight that would allow light-up or electrical arcing to occur.

Example embodiments of a dielectric arrestor insert in accordance with aspects of the present invention will now be described below with reference to FIGS. 3-9.

Figure 1:
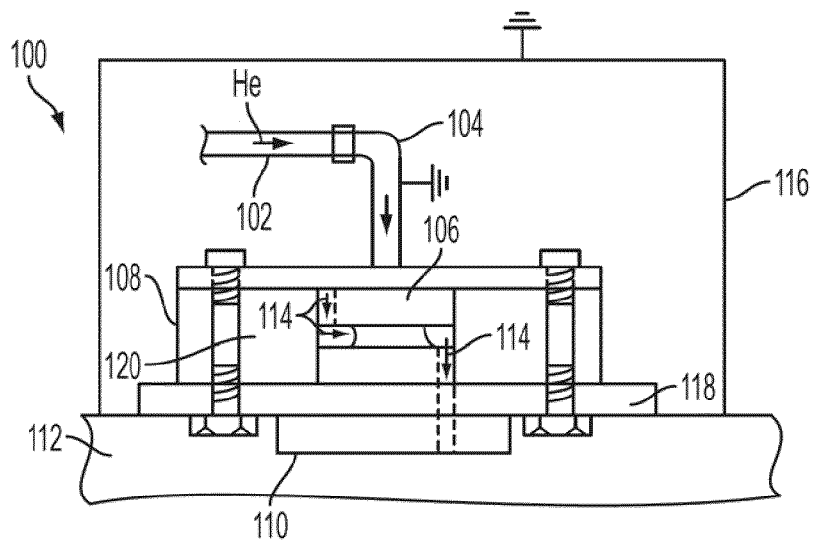
FIG. 1 illustrates a conventional helium supply system to a chamber wafer processing system used during wafer etching processes.
Figure 3:
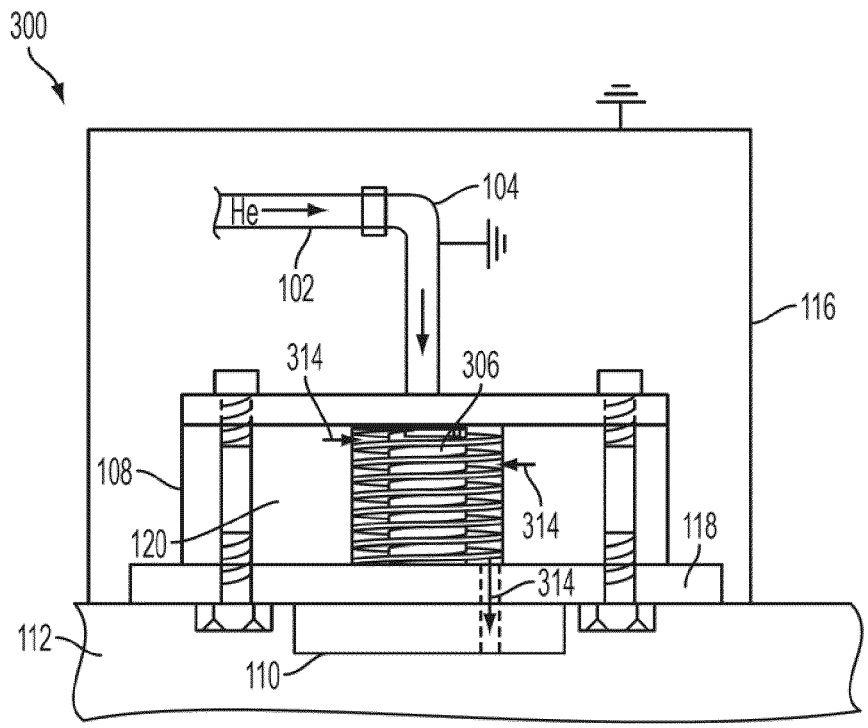
FIG. 3 illustrates an exemplary embodiment in accordance with the present invention of a helium supply system to a chamber wafer processing system used during wafer etching processes.

FIG. 3 is a cross-sectional view of helium supply system 300 operable to provide helium to a chamber wafer processing system 112. Helium supply system 300 is similar to helium supply system 100 as illustrated in FIG. 1, wherein dielectric arrestor insert 106 is replaced with a dielectric arrestor insert 306 in accordance with an aspect of the present invention. System 300 includes flexible helium supply line 102, metallic weldment 104, dielectric arrestor insert 306, an arrestor housing 108, a bowl housing assembly 116. Arrestor housing 108 is shaped to include a cylindrical cavity 120 for holding dielectric arrestor insert 306. Flexible helium supply line 102, metallic weldment 104, dielectric arrestor insert 306 and arrestor housing 108 reside in bowl housing assembly 116. Chamber wafer processing system 112 includes ESC 110 that is operable to electrostatically hold a wafer for processing.

In operation, helium is supplied to chamber wafer processing system 112 via helium supply system 300. The path of the helium through system 300 is indicated by arrows within flexible helium supply line 102, and arrows 314 through dielectric arrestor insert 306.

In accordance with an aspect of the present invention, a helical channel is provided in a dielectric arrestor insert to increase the total length that the helium gas travels in dielectric arrestor insert. Further, in some embodiments a plurality of channels may be included. For similar cross-section areas of individual channels, the total cross-section area within the dielectric arrester insert is directly related to the number of individual channels. Further, the total length that the helium gas travels in each individual channel within the dielectric arrestor insert is inversely related to the number of individual channels. That is to say, a dual channel dielectric arrestor insert will give twice the cross-section flow area as a single channel dielectric arrestor insert, but will only have half the path length of the single channel dielectric arrestor insert. The pitch of a helical channel within a dielectric arrestor insert is the center-to-center distance of one continuous winding.

Various example embodiment dielectric arrestor inserts in accordance with the present invention are discussed herein, showing different numbers of channels with different pitches. The spacing, pitch, depth, and number of channels can be altered to achieve a desirable cross-section area and path length.

An example embodiment of a dielectric arrestor having a single helical channel in accordance with an aspect of the present invention will now be described with reference to FIGS. 4A-4C.

Figure 4A:
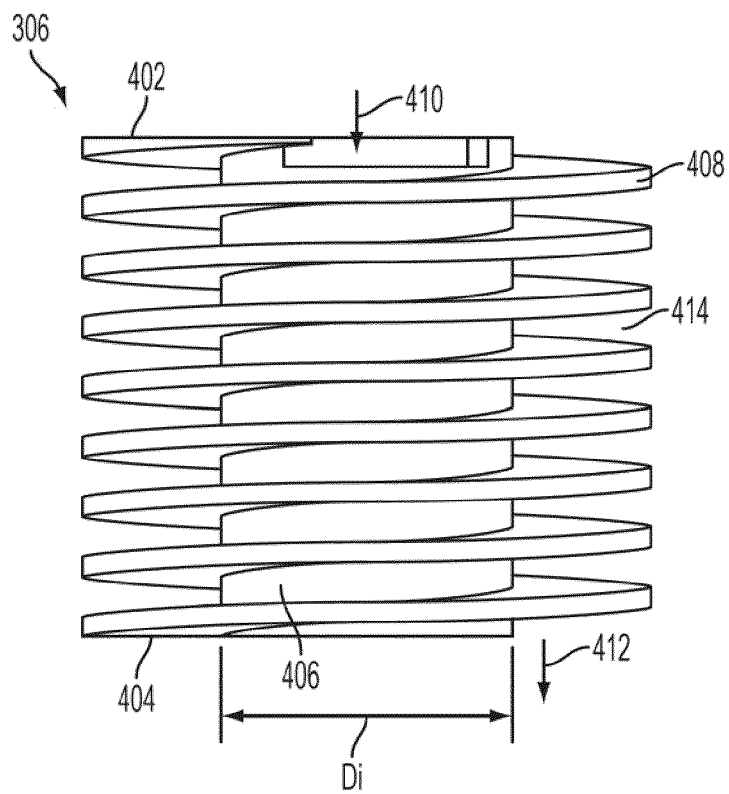
FIG. 4A illustrates an expanded side view of an example single-lead dielectric arrestor insert in accordance with the present invention.

FIG. 4A illustrates an expanded side view of dielectric arrestor insert 306. As illustrated in the figure, dielectric arrestor insert 306 includes a top face 402, a bottom face 404, a core portion 406 and a winding portion 408. Top face 402 includes a helium entry 410, whereas bottom face 404 includes a helium exit 412. Winding portion 408 helically winds around core portion 406 such that adjacent windings form a continuous helical channel 414.

Figure 4B:
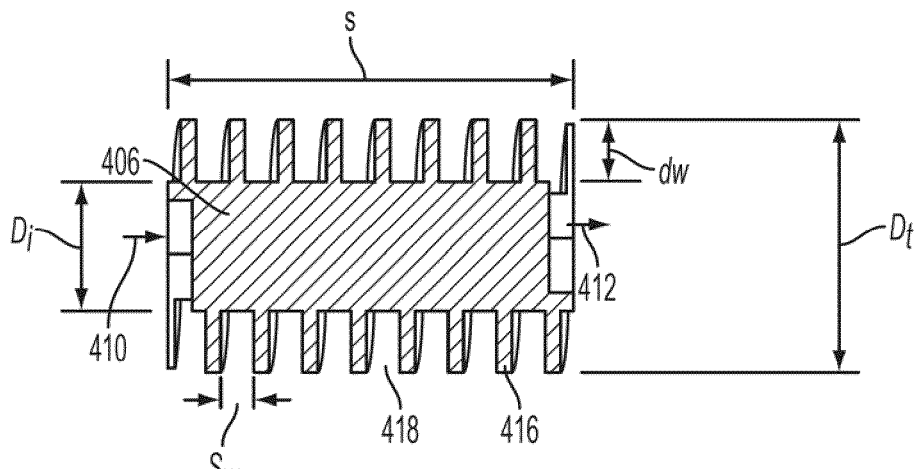
FIG. 4B shows a cross-sectional view of the example dielectric arrestor insert of FIG. 4A.

FIG. 4B is a cross-sectional view of dielectric arrestor insert 306. Helium provided by helium input line 118 enters helium entry 410, proceeds through continuous helical channel 414 and finally exits out helium exit 412 into chamber wafer processing system 112. The total length that the helium gas travels in dielectric arrestor insert 306 includes the length of continuous helical channel 414.

Dielectric arrestor insert 306 has a diameter $D_t$ that corresponds to the diameter of cylindrical cavity 120. Accordingly, cylindrical cavity 120 closes continuous helical channel 414 to form a tube such that helium gas will only pass through continuous helical channel 414. Core portion 406 has a diameter $D_i$, wherein the radial distance of winding portion 408 is $d_w$, wherein $D_t = D_i + 2(d_w)$. The cross-sectional shape of winding portion 408 includes a plurality of rectangular fins 416, separated by a distance $S_w$. The cross-sectional area bounded by rectangular fins 416, core portion 406 and cylindrical cavity 120 is a rectangular area 418 and is equal to $d_w$ times $S_w$.

The length of continuous helical channel 414 is directly proportional to diameter $D_i$, wherein as $D_i$ increases, the length of continuous helical channel 414 increases. The length of continuous helical channel 414 is also directly proportional to length S, and the number of turns of the helical channel. This will be discussed in more detail below.

The available cross-sectional area within dielectric arrestor insert 306 for passing helium into chamber wafer processing system 112 is directly proportional to rectangular area 418. As such, the available cross-sectional area within dielectric arrestor insert 306 for passing helium into chamber wafer processing system 112 is directly proportional to distance $S_w$. As distance $S_w$ increases, the available cross-sectional area increases. Similarly, the available cross-sectional area within dielectric arrestor insert 306 for passing helium into chamber wafer processing system 112 is directly proportional to $d_w$, wherein as distance $d_w$ increases, the available cross-sectional area increases.

Figure 4C:
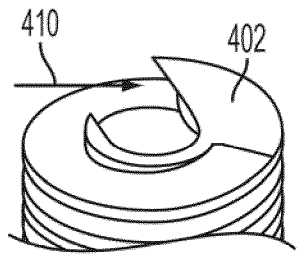
FIG. 4C illustrates an oblique top view of the example dielectric arrestor insert of FIG. 4A.

FIG. 4C shows an oblique top view of dielectric arrestor insert 306 which illustrates a single feed helium entry 410 indicated by the arrow to top face 402.

Figure 2A:
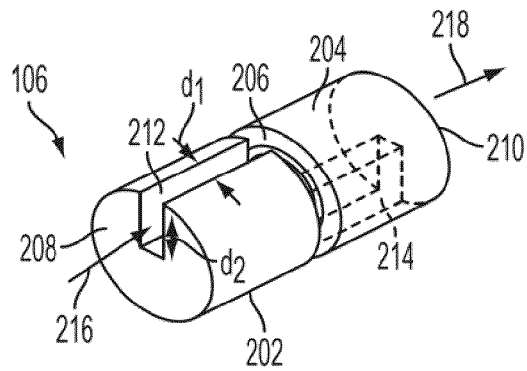
FIG. 2A illustrates an expanded conventional dielectric arrestor insert of FIG. 1.
Figure 2B:
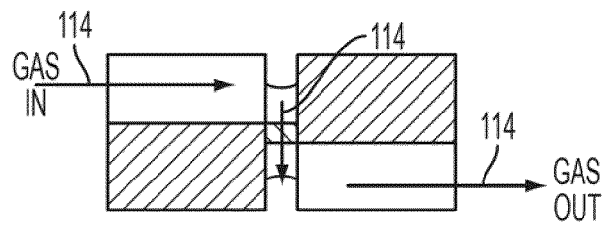
FIG. 2B illustrates a cross-sectional view of FIG. 2A of an expanded conventional dielectric arrestor insert of FIG. 1.

In this example embodiment, the length of continuous helical channel 414 is significantly longer than longitudinal channel 212, circumferential channel 206 and longitudinal channel 214 of FIG. 2B. Accordingly, in accordance with the present invention, the propensity of generating gas plasma in dielectric arrestor insert 306 and helium input line 118 or other components inside the bowl housing assembly 116 significantly decreases.

Another example embodiment of a dielectric arrestor insert having a single helical channel in accordance with an aspect of the present invention will now be described with reference to FIGS. 5A-5C.

Figure 5C:
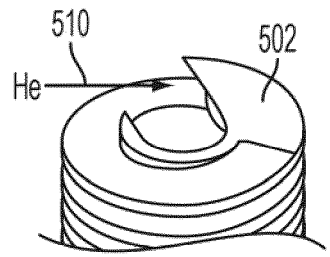
FIG. 5C illustrates an oblique top view of the example dielectric arrestor insert of FIG. 5A.
Figure 5A:
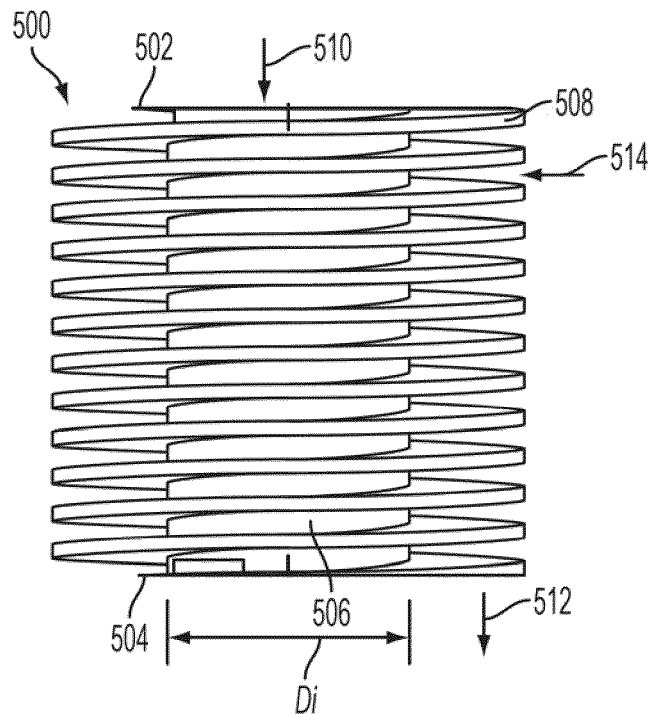
FIG. 5A illustrates an expanded side view of another example dielectric arrestor insert in accordance with the present invention.

FIG. 5A illustrates an expanded side view of an example dielectric arrestor insert 500. Dielectric arrestor insert 500 includes a top face 502, a bottom face 504, a core portion 506 and a winding portion 508. Top face 502 includes a helium entry 510, whereas bottom face 504 includes a helium exit 512. Winding portion 508 helically winds around core portion 506 such that adjacent windings form a continuous helical channel 514.

Figure 5B:
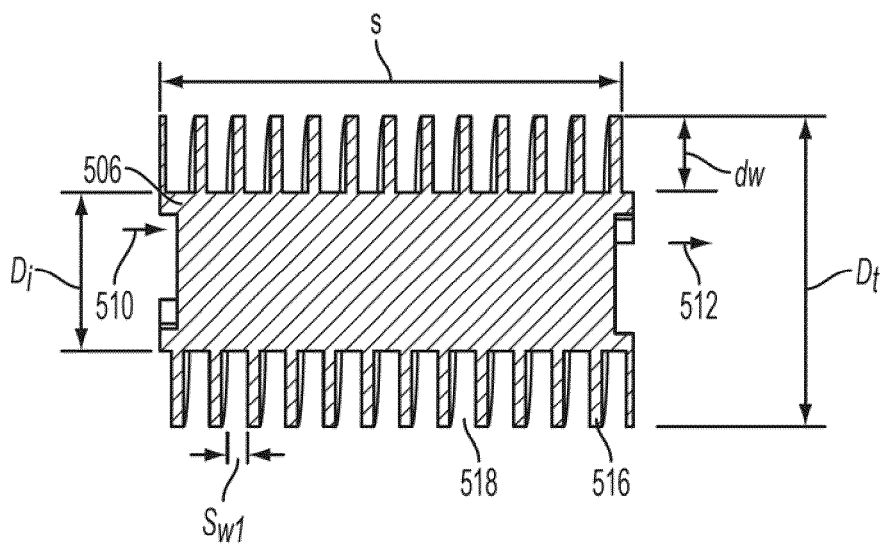
FIG. 5B shows a cross-sectional view of the example dielectric arrestor insert of FIG. 5A.

FIG. 5B is a cross-sectional view of dielectric arrestor insert 500 of FIG. 5A. When disposed within cylindrical cavity 120 of helium supply system 300, cylindrical cavity 120 closes continuous helical channel 514 to form a tube such that helium gas will only pass through continuous helical channel 514. Helium provided by helium input line 118 enters helium entry 510, proceeds through continuous helical channel 514 and finally exits out helium exit 512 into chamber wafer processing system 112. The total length that the helium gas travels in dielectric arrestor insert 500 includes the length of continuous helical channel 514. The cross-sectional shape of winding portion 508 includes a plurality of rectangular fins 516, separated by a distance $S_{w1}$.

FIG. 5C shows an oblique top view of dielectric arrestor insert 500 and illustrates a single feed helium entry 510 indicated by the arrow to top face 502.

Dielectric arrestor insert 500 has a decreased pitch as compared to dielectric arrestor insert 306 of FIG. 4B. In other words, as the pitch of winding portion 508 decreases, the winding portion 508 forms a tighter spiral around core portion 506. Accordingly, the total length that helium gas travels through winding portion 508 of arrestor insert 500 is longer than the total length that helium gas travels through winding portion 408 of dielectric arrestor insert 306 of FIG. 4B. As such, dielectric arrestor insert 500 is able to provide a longer total length for the gas to travel than dielectric arrestor insert 400, thus decreasing the likelihood of plasma light-up or electrical arcing. However, the cross-sectional area of winding portion 508 of arrestor insert 500 is less than the cross-sectional area of winding portion 408 of dielectric arrestor insert 306 of FIG. 4B. As such, dielectric arrestor insert 500 is able to provide less gas into wafer processing system 112 than dielectric arrestor insert 400 at a comparable gas pressure.

Another example embodiment of a dielectric arrestor insert having two helical channels in accordance with an aspect of the present invention will now be described with reference to FIGS. 6A-6C.

Figure 6A:
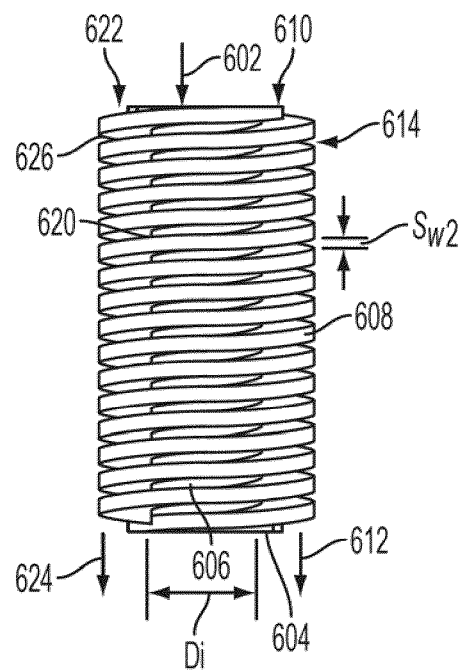
FIG. 6A illustrates an expanded side view of a dual-lead dielectric arrestor insert in accordance with the present invention.

FIG. 6A illustrates an expanded side view of dielectric arrestor insert 600. Dielectric arrestor insert 600 includes a top face 602, a bottom face 604, a core portion 606, a winding portion 608 and a winding portion 620. Top face 602 includes a helium entry 610 and a helium entry 622, whereas bottom face 604 includes a helium exit 612 and a helium exit 624. Winding portion 608 helically winds around core portion 606 such that adjacent outside windings form a continuous helical channel 614. Winding portion 620 helically winds around core portion 606 such that adjacent outside windings form a continuous helical channel 626.

Figure 6B:
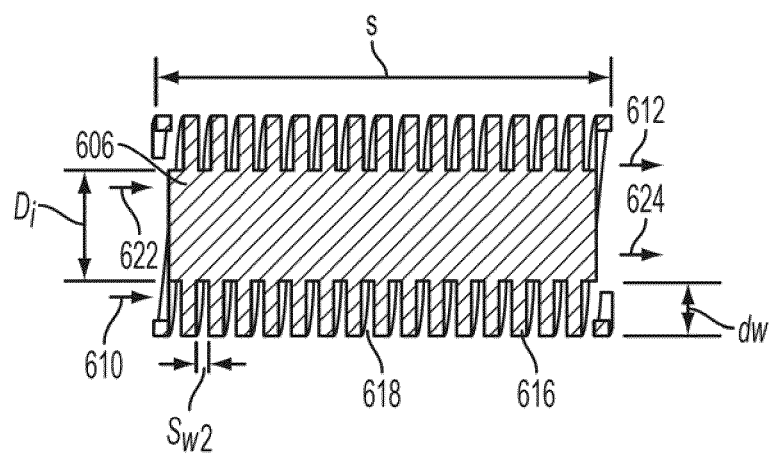
FIG. 6B shows a cross-sectional view of the example dielectric arrestor insert of FIG. 6A.

FIG. 6B is a cross-sectional view of dielectric arrestor insert 600. When disposed within cylindrical cavity 120 of helium supply system 300, cylindrical cavity 120 closes continuous helical channel 614 to form a first tube and closes continuous helical channel 626 to form a second tube, such that helium gas will only pass through continuous helical channel 614 and continuous helical channel 626. Helium provided by helium input line 118 enters helium entry 610 and helium entry 622. Helium entering into helium entry 610 proceeds through continuous helical channel 614, exits helium exit 612 and enters into chamber wafer processing system 112. Helium entering into helium entry 622 proceeds through continuous helical channel 626, exits helium exit 624 and additionally enters into chamber wafer processing system 112. The total length that the helium gas travels in dielectric arrestor insert 600 includes the length of either one of continuous helical channel 614 and continuous helical channel 626. The cross-sectional shape of each of winding portion 608 and winding portion 620 includes a plurality of rectangular fins 616, separated by a distance $S_{w3}$.

Figure 6C:
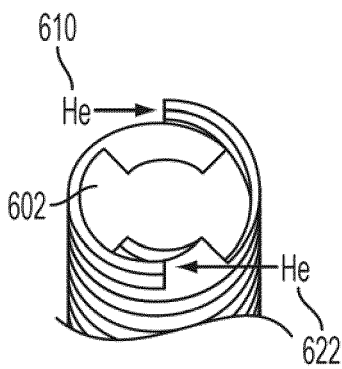
FIG. 6C illustrates an oblique top view of the example dielectric arrestor insert of FIG. 6A.

FIG. 6C shows an oblique top view of dielectric arrestor insert 600 and illustrates a dual feed helium entry system including helium entry 610 and helium entry 622 indicated by the arrows to top face 602.

Each of continuous helical channel 614 and continuous helical channel 614 of dielectric arrestor insert 600 has an increased pitch as compared to continuous helical channel 514 of dielectric arrestor insert 500. In other words, as the pitch of each of continuous helical channel 614 and continuous helical channel 614 increases over the pitch of continuous helical channel 514, the total length that helium gas travels through either one of continuous helical channel 614 and continuous helical channel 614 of dielectric arrestor insert 600 decreases from the total length that helium gas travels through continuous helical channel 514 of dielectric arrestor insert 500. As such, each of continuous helical channel 614 and continuous helical channel 614 of dielectric arrestor insert 600 provides a shorter total length for the gas to travel than dielectric arrestor insert 500, thus increasing the likelihood of plasma light-up or electrical arcing. However, the cross-sectional area of the combination of continuous helical channel 614 and continuous helical channel 614 of dielectric arrestor insert 600 is greater than the cross-sectional area of continuous helical channel 514 of dielectric arrestor insert 500. As such, dielectric arrestor insert 600 provides a greater amount of gas into wafer processing system 112 than dielectric arrestor insert 500 at a comparable gas pressure.

Another example embodiment of a dielectric arrestor insert having four helical channels in accordance with an aspect of the present invention will now be described with reference to FIG. 7.

Figure 7:
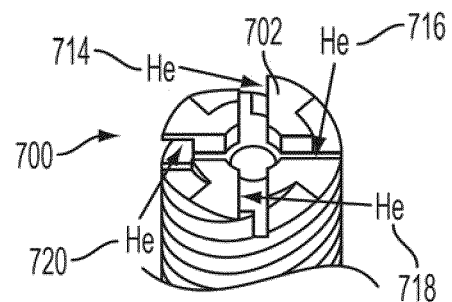
FIG. 7 illustrates an oblique top view of a quad-lead dielectric arrestor insert in accordance with the present invention.

FIG. 7 illustrates another example embodiment with aspect of the present invention of an oblique top view of a multiple feed helium path dielectric arrestor insert 306 which includes in this example four feeds 714, 716, 718 and 720 to top face 702.

FIG. 7 demonstrates another way to increase the amount of helium gas provided to the chamber wafer processing system 112 of FIG. 3 while still maintaining additional increased path length. This will increase the total helium gas flow to an acceptable level while decreasing the likelihood for generating plasma as discussed above.

Each of the four continuous helical channels of dielectric arrestor insert 700 has an increased pitch as compared to each of continuous helical channel 614 and continuous helical channel 614 of dielectric arrestor insert 600. In other words, as the pitch of each of the four continuous helical channels of dielectric arrestor insert 700 increases over the pitch of each of continuous helical channel 614 and continuous helical channel 614 of dielectric arrestor insert 600, the total length that helium gas travels through any of the four continuous helical channels of dielectric arrestor insert 700 decreases from the total length that helium gas travels through each of continuous helical channel 614 and continuous helical channel 614 of dielectric arrestor insert 600. As such, each of the four continuous helical channels of dielectric arrestor insert 700 provides a shorter total length for the gas to travel than each of continuous helical channel 614 and continuous helical channel 614 of dielectric arrestor insert 600, thus increasing the likelihood of plasma light-up or electrical arcing. However, the cross-sectional area of the combination of the four continuous helical channels of dielectric arrestor insert 700 is greater than the cross-sectional area of the combination of continuous helical channel 614 and continuous helical channel 614 of dielectric arrestor insert 600. As such, dielectric arrestor insert 700 is able to provide a greater amount of gas into wafer processing system 112 than dielectric arrestor insert 600 at comparable gas pressure.

In the above-discussed embodiments of the present invention, the cross-sectional shape of the gas feed path is rectangular. In accordance with aspects of the present invention, the cross-sectional shape of the gas feed path may be any desired shape. A cross-sectional shape of the gas feed path may be designed to provide specific amounts of gas into chamber wafer processing system 112. Two other example dielectric arrestor inserts are illustrated in FIGS. 8 and 9.

Figure 8:
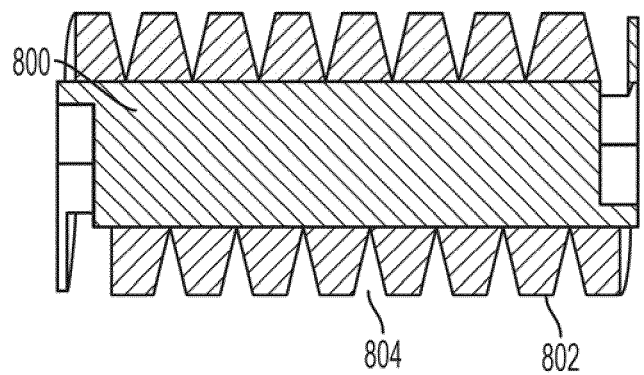
FIG. 8 illustrates a cross-sectional view of another example dielectric arrestor insert in accordance with the present invention.

FIG. 8 is a cross-sectional view of a dielectric arrestor insert 800. As illustrated in the figure, dielectric arrestor insert 800 has a winding portion 802. Winding portion 802 create a continuous helical channel 804. The cross-sectional shape of continuous helical channel 804 is triangular.

Figure 9:
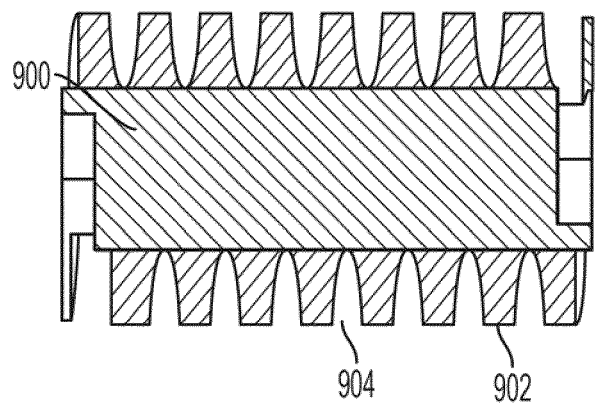
FIG. 9 illustrates a cross-sectional view of another example dielectric arrestor insert in accordance with the present invention.

FIG. 9 is a cross-sectional view of a dielectric arrestor insert 900. As illustrated in the figure, dielectric arrestor insert 900 has a winding portion 902. Winding portion 902 create a continuous helical channel 904. The cross-sectional shape of continuous helical channel 904 is curved.

The above discussed example embodiments of a dielectric arrestor insert in accordance with aspects of the present invention have a continuous helical channel, or continuous helical channels, to increase a gas path length. Other embodiments may use non-helical channels to increase a gas path length. Non-limiting examples of other embodiments include dielectric arrestor inserts having a curved or serpentine channel, or curved or serpentine channels.

In accordance with aspects of the present invention, at least one non-linear channel is provided in a dielectric arrestor insert to increase the total length that the helium gas travels in dielectric arrestor insert. For similar cross-section areas of individual channels, the total cross-section area within the dielectric arrester insert is directly related to the number of individual channels. Further, the total length that the helium gas travels in each individual channel within the dielectric arrestor insert is inversely related to the number of individual channels. The spacing, pitch, depth, and number of channels can be altered to achieve a desirable cross-section area, which is directly related to an amount of gas that can be provided into chamber wafer processing system for a predetermine pressure. Further the spacing, pitch, depth, and number of channels can be altered to achieve a desirable path length, which is inversely related to the likelihood of plasma light-up or electrical arcing.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A dielectric arrestor insert for use in a chamber wafer processing system having a gas input line, an arrestor housing and a wafer processing space, the input line being operable to provide gas to the arrestor housing, the arrestor housing being operable to house said dielectric arrestor insert, said dielectric arrestor insert comprising:
    a gas entry portion arranged to receive the gas from the input line;
    a non-linear channel; and
    a gas exit portion,
    wherein said non-linear channel is arranged to deliver the gas from said gas entry portion to said gas exit portion,
    wherein said gas exit portion is arranged to deliver the gas from said non-linear channel to the wafer processing space, and
    wherein said gas entry portion, said non-linear channel and said gas exit portion provide a continuous non-linear path for the gas.

2. The dielectric arrestor insert of claim 1, wherein said non-linear channel comprises a helical channel.

3. The dielectric arrestor insert of claim 2, wherein said helical channel has a rectangular cross-sectional shape.

4. The dielectric arrestor insert of claim 2, wherein said helical channel has a curved cross-sectional shape.

5. The dielectric arrestor insert of claim 2, wherein said helical channel as a triangular cross-sectional shape.

6. The dielectric arrestor insert of claim 1, further comprising:
    a second gas entry portion arranged to receive the gas from the input line;
    a second non-linear channel; and
    a second gas exit portion,
    wherein said second non-linear channel is arranged to deliver the gas from said second gas entry portion to said second gas exit portion, and
    wherein said second gas exit portion is arranged to deliver the gas from said second non-linear channel to the wafer processing space.

7. The dielectric arrestor insert of claim 1, wherein said non-linear channel comprises a serpentine channel.

8. A dielectric arrestor insert for use in a chamber wafer processing system having a gas input line, an arrestor housing and a wafer processing space, the input line being operable to provide gas to the arrestor housing, the arrestor housing being operable to house said dielectric arrestor insert, said dielectric arrestor insert comprising:
    a gas entry portion arranged to receive the gas from the input line;
    a helical channel; and
    a gas exit portion,
    wherein said helical channel is arranged to deliver the gas from said gas entry portion to said gas exit portion, and
    wherein said gas exit portion is arranged to deliver the gas from said helical channel to the wafer processing space.

9. A dielectric arrestor insert for use in a chamber wafer processing system having a gas input line, an arrestor housing and a wafer processing space, the input line being operable to provide gas to the arrestor housing, the arrestor housing being operable to house said dielectric arrestor insert, said dielectric arrestor insert comprising:
    a gas entry portion arranged to receive the gas from the input line;
    a serpentine channel; and
    a gas exit portion,
    wherein said serpentine channel is arranged to deliver the gas from said gas entry portion to said gas exit portion, and
    wherein said gas exit portion is arranged to deliver the gas from said serpentine channel to the wafer processing space.

* * * * *